United States Patent [19]
Yoon

[11] Patent Number: 5,803,965
[45] Date of Patent: Sep. 8, 1998

[54] METHOD AND SYSTEM FOR MANUFACTURING SEMICONDUCTOR DEVICE

[75] Inventor: Jung Kee Yoon, Seoul, Rep. of Korea

[73] Assignee: LG Electronics, Inc., Seoul, Rep. of Korea

[21] Appl. No.: 689,682

[22] Filed: Aug. 13, 1996

[30] Foreign Application Priority Data

Oct. 17, 1995 [KR] Rep. of Korea ................ 1995/35772

[51] Int. Cl.$^6$ ........................................ C30B 1/02
[52] U.S. Cl. ..................... 117/4; 117/5; 117/8; 117/9; 117/201; 117/204; 117/902; 117/930
[58] Field of Search .................. 117/4, 5, 8, 9, 117/930, 902, 204, 201

[56] References Cited

U.S. PATENT DOCUMENTS

| | | | |
|---|---|---|---|
| 3,663,897 | 5/1972 | Broom | 332/7.51 |
| 3,857,279 | 12/1974 | Salzer et al. | 73/67.2 |
| 5,040,865 | 8/1991 | Chen et al. | 350/96.14 |
| 5,249,193 | 9/1993 | Watanabe | 372/23 |

FOREIGN PATENT DOCUMENTS

| | | | |
|---|---|---|---|
| 3-280528 | 12/1991 | Japan | 117/904 |
| 4-53123 | 2/1992 | Japan | 117/904 |

OTHER PUBLICATIONS

Bean et al., "Epitaxial Laser Crystallization of Thin-film Amorphous Silicon", Applied Physics Letters 33(3) pp. 227–230, Aug. 1978.

Primary Examiner—Robert Kunemund
Attorney, Agent, or Firm—Morgan, Lewis & Bockius LLP

[57] ABSTRACT

A method and system for manufacturing a semiconductor device having a semiconductor layer using a pulsed laser includes the steps of generating a laser beam using a solid laser source, generating a multi-harmonic wave from the laser beam using a multi-harmonic oscillator, filtering the multi-harmonic wave, and irradiating the filtered wave onto the semiconductor layer.

25 Claims, 3 Drawing Sheets

METHOD AND SYSTEM FOR MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device through crystallization and activation.

2. Discussion of the Related Art

Forming a low temperature polycrystalline silicon layer of good quality is a key technology in manufacturing a thin film transistor-liquid crystal device of high resolution and low cost. One current method uses a pulsed ultraviolet beam of an excimer laser irradiated onto an amorphous silicon thin film, thereby instantaneously melting and crystallizing the amorphous silicon thin film.

In a method of manufacturing a polycrystalline silicon liquid crystal display device by using a polycrystalline silicon or a method of manufacturing a dynamic random access memory (DRAM), after implanting ions into a semiconductor layer, the crystal structure of the semiconductor layer surface may be damaged due to the ion-implantation. The damaged portion of such a crystal structure deteriorates the contact characteristics to an upper wiring, thereby causing the deterioration of the device characteristics. Accordingly, a method has been proposed where a laser irradiates the damaged portion, thereby restoring the crystal defect. In a method of manufacturing a DRAM, a high temperature heat treatment under a nitrogen gas atmosphere, a rapid thermal annealing (RTP), or the equivalent is primarily used. However, in a method of manufacturing the liquid crystal display device, it is difficult to use a high temperature heat treatment because the semiconductor device is formed on a glass substrate. Therefore, the method of crystallizing and activating the semiconductor layer has a great significance.

In general, a laser used in a method of crystallizing and activating a semiconductor layer must irradiate a target with a pulsed laser beam having a short wavelength and a low permeability in order to transmit a high energy only to the thin semiconductor layer and to prevent heat transmission to a substrate located thereunder. As a result, the excimer laser of short wavelength is primarily used among the gas lasers.

In the method of crystallizing and activating the semiconductor layer by using such a laser, it is possible to manufacture a high performance polycrystalline silicon thin film transistor on a conventional glass substrate with a large area at a low temperature without an expensive substrate, such as quartz. Accordingly, a drive circuit incorporating a thin film transistor-liquid crystal display device can be manufactured at a low cost.

As shown in FIG. 1, a device used in the crystallization and activation using the laser is composed of a laser radiation portion 11, an optical system 12, and a substrate 13. A laser beam is generated from laser radiation portion 11, and the optical system 12 is composed of a reflecting mirror 12-1 and a homogenizer 12-2 having a lens unit. Through a homogenizer 12-2 controlling the strength, size, shape and spatial uniformity of the laser beam, the laser beam irradiates a semiconductor layer 14 formed on substrate 13 to crystallize and activate the semiconductor layer 14.

Laser radiation portion 11 is an excimer laser and generates a short wavelength laser beam of approximately 196~308 nm, using a pulsed gas laser using a gas such as KrF, ArF, XeCl, XeF or the like. In a short wavelength laser beam, most of the energy is absorbed at a depth of hundreds of Å from the semiconductor layer, and particularly, from the surface of the silicon thin film.

At this time, the pulse width of the laser beam is several tens of nanoseconds. The silicon thin film instantaneously melts during this time and then solidifies so that the interior of the silicon thin film crystallizes, thereby obtaining the polycrystalline silicon thin film.

Furthermore, in order to manufacture the polycrystalline silicon thin film having a wide area, a method has been adopted where the laser beam is overlapped, part by part, as it scans. As shown in FIG. 2, unit laser beam 21 of equal size is located such that the boundary thereof overlaps each other. Then, the scan irradiation is performed over the entire surface of an amorphous silicon thin film 20.

When such a crystallization process is performed, the uniformity of the thin film is determined by factors such as laser power, degree of overlap, film thickness, and substrate temperature. In other words, the grain size of the inside of the thin film and the mobility obtained when forming the device are greatly changed according to a minute variation of such factors.

Moreover, since the method of overlapping and scanning the laser beam is used in order to manufacture the polycrystalline silicon thin film having a wide area, each pulse of the laser beam has to be uniform in order to obtain a thin film of good quality having uniform characteristics over the entire area.

However, since a gas laser is used in the conventional method of crystallizing and activating the semiconductor layer, it is difficult to maintain a pulse to pulse power stability of the gas laser. Therefore, using such a laser beam results in non-uniform characteristics of the polycrystalline silicon thin film. The uniformity of the characteristics of the device formed with the thin film transistor having non-uniform characteristics is also deteriorated. Furthermore, in terms of productivity, the production operating time of the equipment is reduced, thereby deteriorating the yield. Therefore, research in maintaining the pulse to pulse power stability of the laser is necessary.

In another conventional method of crystallizing and activating the semiconductor layer, a solid laser (e.g., a rubidium laser) having a wavelength in the visible region is used, instead of the excimer laser.

In the case of using a visible wavelength solid laser, such as a rubidium laser, when the polycrystalline silicon thin film is manufactured, the absorption coefficient of the amorphous silicon sample is about 0.6 $\mu m^{-1}$ in the visible region. Therefore, the length of the absorption depth becomes about 1 $\mu m$ in the visible ray region. Accordingly, if a solid laser is used for crystallizing and activating the thin film having a thickness of about 1000 Å, only about 10% of the incident energy is absorbed and the rest 90% is transmitted, thereby causing a large energy loss.

SUMMARY OF THE INVENTION

Accordingly, the present invention is directed to a method of manufacturing a semiconductor device that substantially obviates one or more of the problems due to limitations and disadvantages of the related art.

In order to solve the aforementioned problems, it is an object of the present invention to provide a method of manufacturing a semiconductor device which is suitable to obtain a semiconductor layer having uniform characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a semiconductor device including a semiconductor layer includes the steps of generating a laser beam using a solid laser source; generating a multi-harmonic wave from the laser beam using a multi-harmonic oscillator; filtering the multi-harmonic wave; and irradiating the filtered wave onto the semiconductor layer. The method crystallizes and activates the semiconductor layer.

In another aspect, a system for manufacturing a semiconductor device having a semiconductor layer including a solid laser source for producing a laser beam; an oscillator for generating a multi-harmonic wave in response to the laser beam; a filter for producing a wave having a wavelength corresponding to an absorption rate of the semiconductor layer; and an optical system for directing the filtered wave onto the semiconductor layer.

In a further aspect, in a method of crystallizing a semiconductor layer by using a pulse laser for an excellent pulse to pulse stability and easy maintenance, a method is provided for manufacturing a semiconductor device including the steps of generating a laser beam from a laser radiation part using a solid laser, generating a multi-harmonic wave from the laser beam using a multi-harmonic oscillator generation part using a non-linear crystal, and filtering the multi-harmonic wave and irradiating it to the semiconductor layer.

In another aspect, a method of activating a semiconductor layer having a damaged crystal structure caused by an ion-implantation or an ion-doping, using a pulse laser includes a method of manufacturing a semiconductor device including the steps of generating a laser beam from a laser radiation part using a solid laser, generating multi-harmonic wave from the laser beam using a multi-harmonic oscillator generation part using a non-linear crystal, and filtering the multi-harmonic wave and irradiating it to the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
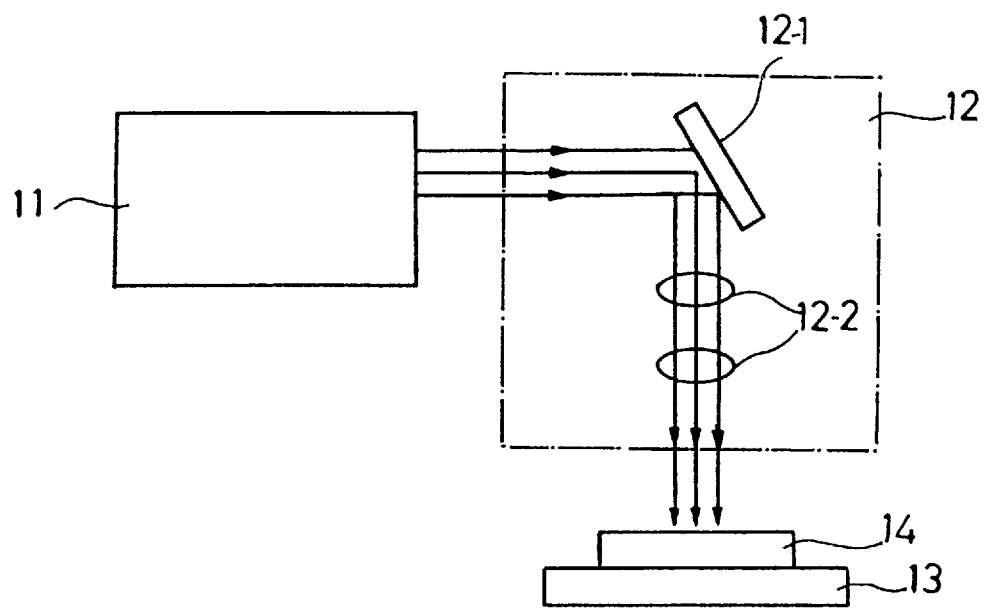
FIG. 1 is a schematic diagram of a device used in the conventional crystallization and activation process.
Figure 2:
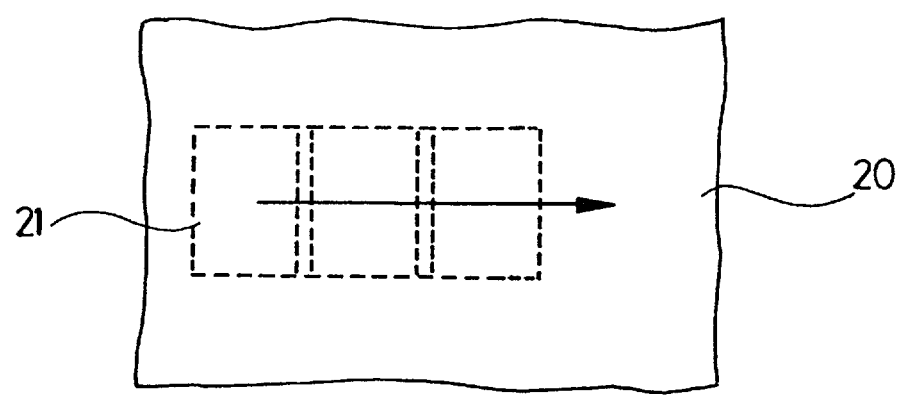
FIG. 2 is a schematic diagram of a scanning method of a laser beam in the conventional crystallization of a semiconductor layer.
Figure 3:
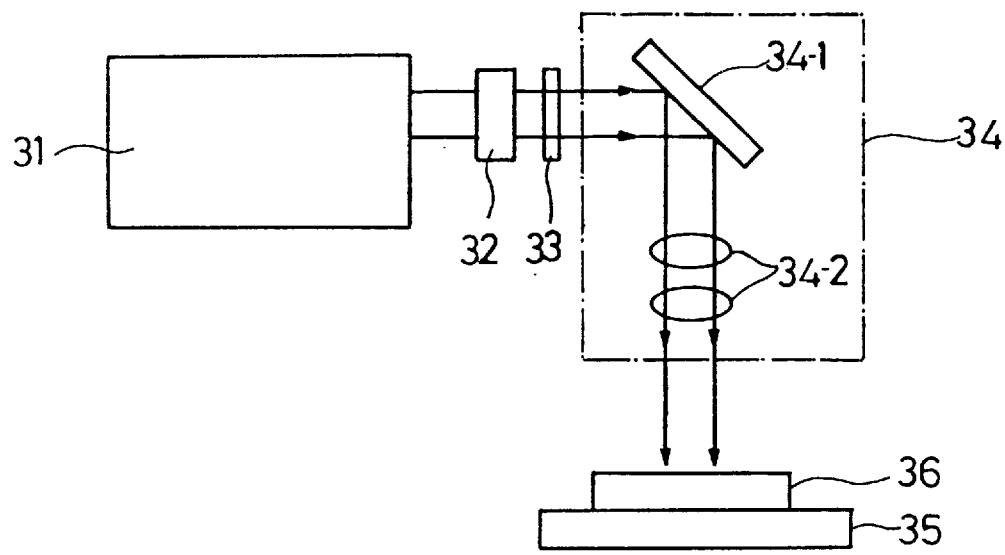
FIG. 3 is a schematic diagram of a device used in the crystallization and activation process according to the present invention.

The crystallization and activation device used for crystallizing and activating a semiconductor layer of the present invention is shown in FIG. 3.

Referring to FIG. 3, the crystallization and activation device includes a laser radiation portion 31 which uses an Nd-based solid laser. A multi-harmonic oscillator generation portion 32 receives the laser beam generated from laser radiation portion 31 and generates a beam which is a composite of several harmonic waves whose oscillator frequencies are multiples of the oscillator frequency of an incident laser beam. A filter portion 33 extracts and passes a laser beam of a short wavelength whose absorptivity is the greatest among the beams of the composite harmonic waves of several oscillator frequencies considering the type and thickness of the semiconductor layer of the irradiation target.

Furthermore, an optical system 34 includes a reflecting mirror 34-1 that directs the light path and a homogenizer 34-2 having a lens unit with multiple lenses that controls the size and spatial uniformity of the beam. A semiconductor layer 36 is formed on a substrate 35.

Figure 4A:
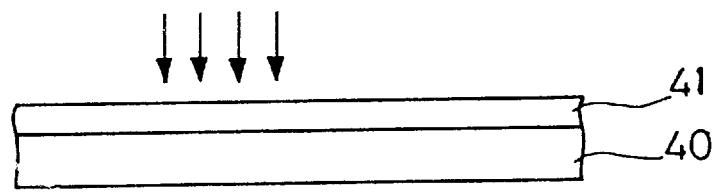
FIGS. 4A to 4C are cross-sectional views of the crystallization shape of the semiconductor layer according to the present invention.
Figure 4B:
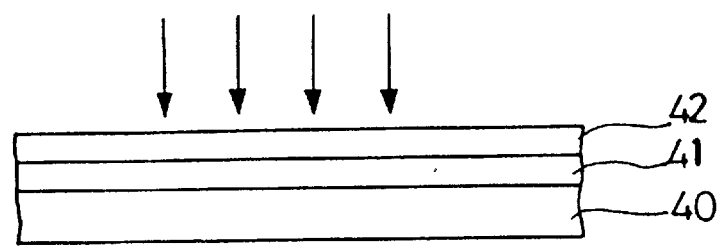
Figure 4C:
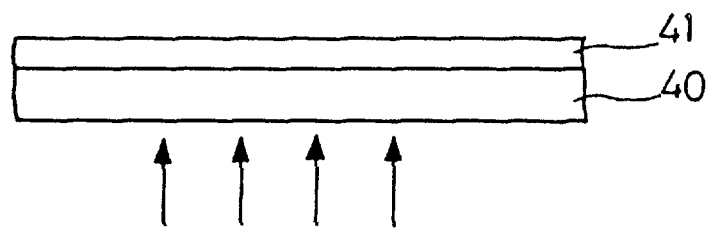

FIGS. 4A to 4C show several ways of crystallizing an amorphous silicon thin film formed on a glass substrate in accordance with the present invention. In FIG. 4A, the laser beam is directly irradiated onto an amorphous silicon thin film 41 formed on a substrate 40. In FIG. 4B, the laser beam is irradiated onto a thin capping layer 42, such as a nitride film or an oxide film, that has been deposited over the amorphous silicon thin film 41. In FIG. 4C, the amorphous silicon thin film 41 is irradiated by the laser beam through the back side of substrate 40, thereby crystallizing amorphous silicon thin film 41.

Figure 5A:
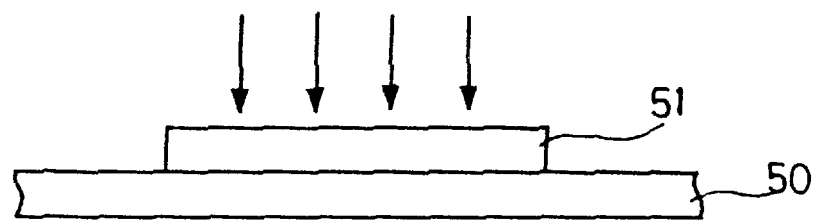
FIGS. 5A and 5B are cross-sectional views of the activation shape of the semiconductor layer having a damaged crystal structure according to the present invention.
Figure 5B:

After the ion-implantation or ion-doping of the polycrystalline silicon layer or the amorphous silicon layer, an activation is performed in order to restore a crystal defect on the silicon surface due to the ion-implantation or ion-doping. As shown in FIG. 5A, the laser beam may be directly irradiated onto a semiconductor layer 51 having a damaged crystal structure. As shown in FIG. 5B, the laser beam may be irradiated onto a structure in which a capping layer 52, such as a nitride film or an oxide film, is formed on semiconductor layer S1 having the damaged crystal structure, thereby activating the semiconductor layer.

When a polycrystalline silicon thin film is manufactured by irradiating the laser beam onto an amorphous silicon layer, a solid laser is used as the source of the laser beam. Thus, the pulse to pulse power stability is improved and the grain size of the polycrystalline silicon thin film and its electrical properties become uniform. Furthermore, when a device such as a thin film transistor is manufactured, mobility and other characteristics of the device become uniform. Therefore, a circuit having a stable operation can be manufactured and a crystal defect at the silicon surface that is damaged due to ion-implantation or ion-doping can be removed. In addition, because maintenance is easier relative to a gas laser, the production operating time is improved to improve productivity.

For the laser radiation portion, a solid laser is used where an active medium is a solid. Particularly, a neodymium (Nd)based laser such as Neodymium doped Yttrium Aluminum Garnet (Nd:YAG) laser, Neodymium doped GLASS (Nd:GLASS) laser or the like is used. Moreover, the wavelength of the laser beam generated from the Nd-based solid laser is in the infrared region of about 1 $\mu$m. Since the short wavelength of the ultraviolet ray region is primarily necessary in the crystallization and activation of the silicon thin film, the Nd-based laser cannot be used as is. Therefore, in the present invention, multi-harmonic waves, i.e., secondary, cubic, etc., are generated using a multi-harmonic oscillator generation portion. Among these, with respect to the silicon layer of the wavelength having a high absorptivity to the semiconductor layer, i.e., 1000 Å, ultraviolet emissions with short wavelengths within 300~400 nm are used. The multi-harmonic oscillator generation portion is composed of a non-linear crystal. Particularly, any one of $KTiOPO_4$ (KTP), KDP, or other types of non-linear crystals can be used.

The principle of the multi-harmonic wave generation using such non-linear crystals is as follows.

In general, when an electromagnetic wave of strong intensity passes through a non-linear crystal, the electrical polarization $\vec{P}$ is not proportional to the electric field $\vec{E}$ ($\vec{P} \neq \epsilon_0 \chi \vec{E}$), but is expanded to a higher degree. This is expressed in the following equation:

$$\vec{P} = \epsilon_0(\chi \vec{E} + \chi_2 \vec{E}^2 + \chi_3 \vec{E}^3 + \ldots) \qquad (1)$$

Here, $\chi$ is a susceptibility where the linear coefficient $\chi$ has the largest value, and the value gradually decreases from $\chi_2$ to $\chi_3$.

If the harmonic wave of $\vec{E} = E_0 \sin \omega t$ is incident upon such medium, the polarization $\vec{P}$ is expressed as follows.

$$\begin{aligned} P &= \epsilon_0 \chi E_0 \sin\omega t + \epsilon_0 \chi_2 E_0^2 \sin^2\omega t + \epsilon_0 \chi_3 E_0^3 \sin^3\omega t + \ldots \qquad (2) \\ &= \epsilon_0 \chi E_0 \sin\omega t + \frac{\epsilon_0 \chi_2}{2} E_0^2 (1 - \cos 2\omega t) + \\ &\quad \frac{\epsilon_0 \chi_3}{2^2} E_0^3 (3\sin\omega t - \sin 3\omega t) + \ldots \end{aligned}$$

Therefore, as shown in equation (2), when an electromagnetic wave of oscillator frequency $\omega$ passes through the non-linear crystal medium, depending on the electrical polarization of the medium, multi-harmonic waves are generated where the harmonic wave has an oscillator frequency $\omega$ the same as that of the incident wave and composite harmonic waves of oscillator frequencies of 2 $\omega$, 3 $\omega$, ..., n $\omega$, ... (where, $\omega$ is an oscillator frequency of the incident wave).

Accordingly, in the present invention, in filtering and using multi-harmonic waves in which an oscillator frequency of the harmonic wave is a multiple (two, three, etc.) to that of the incident wave generated through the non-linear crystal medium of the multi-harmonic oscillator generation portion, an optical and electromagnetic filter is used to extract a desired beam of oscillator frequency and applied in the crystallization and activation of the semiconductor layer. Optionally, if the filter is not used, a desired beam of oscillator frequency is extracted using a transmission angle characteristic of the wave according to the oscillator frequency, and is used in the crystallization and activation of the semiconductor layer.

Moreover, in accordance with the present invention, the grain size and the mobility of the TFT can be increased by varying the pulse width of a laser beam. During silicon crystallization, the rate of solidification of a silicon that was melted through laser energy significantly affects the grain size and mobility of the TFT. In particular, reducing the rate of solidification increases both the grain size and the TFT mobility. For excimer lasers, the pulse width of a laser beam is fixed in accordance with the laser oscillator geometry and the characteristic of the medium. For solid lasers, however, the pulse width may be varied through Q-switching, which changes the power and temporal characteristic of the beam obtained from a laser oscillator by enhancing the storage and dumping of electronic energy in and out of the lasing medium, respectively.

For Q-switching, the quality factor "Q" is defined as follows:

$$Q = \frac{\text{energy stored in the cavity}}{\text{energy loss of cavity}}$$

where "cavity" is the lasing medium. When the stored energy of the cavity increases through optical pumping, cavity loss is also increased to lower the quality factor Q and prevent laser oscillation. During that time, when population inversion is increased to be considerably higher than the threshold of the normal lasing action and if Q is again increased, the stored energy of the cavity can be released in a short period of time (see Walter Koechner, "Solid State Laser Engineering," Springer-Verlag, 1988 for more details on Q-switching).

Thus, using a solid laser, the pulse width may be varied to change the solidification rate for large grain sizes to produce high performance polysilicon films. As the pulse width is increased for the laser beam of the solid laser, the rate of solidification is reduced (while within the scope of parameters where the substrate is not overheated and damaged). The pulse width of solid lasers using Q-switching may be varied by many hundreds of nanoseconds (or more) while the pulse width of excimer lasers is only about 20–50 ns. Accordingly, the grain size and the mobility of the TFT can be improved by using a solid laser with increased pulse width.

It will be apparent to those skilled in the art that various modifications and variations can be made in the method of manufacturing a semiconductor device of the present invention without departing from the spirit or scope of the invention. Thus, it is intended that the present invention cover the modifications and variations of this invention provided they come within the scope of the appended claims and their equivalents.

What is claimed is:

1. A method of manufacturing a semi-conductor device including a semiconductor layer, the method comprising the steps of:

generating a laser beam using a solid laser source;

generating a multi-harmonic wave from the laser beam using a multi-harmonic oscillator;

filtering the multi-harmonic wave; and irradiating the filtered wave onto the semiconductor layer to crystallize the semiconductor layer.

2. The method according to claim 1, wherein the semiconductor layer includes an amorphous silicon and the method crystallizes the amorphous silicon.

3. The method according to claim 2, wherein the step of generating the laser beam includes the step of varying a pulse width of the laser beam to reduce the rate of crystallizaton of the amorphous silicon.

4. The method according to claim 3, wherein the step of varying the pulse width of the laser beam increases the grain size of the amorphous silicon.

5. The method according to claim 3, wherein the step of varying the pulse width of the laser beam increases the mobility of the amorphous silicon.

6. The method according to claim 3, wherein the pulse width of the laser beam is increased using Q-switching.

7. The method according to claim 1, wherein the method activates the semiconductor layer having a crystal structure after ion-implantation or ion-doping.

8. The method according to claim 1, wherein the semiconductor device includes a capping layer on the semiconductor device and the irradiating step includes irradiating the filtered wave onto the semiconductor layer through the capping layer.

9. The method according to claim 8, wherein the capping layer includes an insulating layer.

10. The method according to claim 9, wherein the insulating layer includes one of a silicon nitride film or a silicon oxide film.

11. The method according to claim 1, wherein the semiconductor layer is formed on a substrate and the irradiating step includes irradiating the filtered wave onto the semiconductor layer through the substrate.

12. The method according to claim 1, wherein the solid laser includes an Nd-based laser.

13. The method according to claim 12, wherein the Nd-based laser includes one of an Nd:YAG laser and an Nd:GLASS laser.

14. The method according to claim 1, wherein the step of generating the multi-harmonic wave includes using a non-linear crystal in the multi-harmonic oscillator.

15. The method according to claim 14, wherein the non-linear crystal includes one of KTiOPO4 and KDP.

16. The method according to claim 1, wherein the filtered wave has a wavelength corresponding to an absorption rate of the semiconductor layer.

17. The method according to claim 16, wherein the wavelength has an approximate range of 300–400 nm.

18. A system for manufacturing a semiconductor device having a semiconductor layer comprising:

a solid laser source for producing a laser beam;

an oscillator for generating a multi-harmonic wave in response to the laser beam;

a filter for producing a wave having a wavelength corresponding to an absorption rate of the semiconductor layer; and an optical system for directing the filtered wave onto the semiconductor layer.

19. The system according to claim 18, wherein the solid laser source includes an Nd-based laser.

20. The system according to claim 19, wherein the Nd-based laser includes one of an Nd:YAG and an Nd:GLASS laser.

21. The system according to claim 18, wherein the wavelength has an approximate range of 300–400 nm.

22. The system according to claim 18, wherein the oscillator includes a non-linear crystal.

23. The system according to claim 22, wherein the non-linear crystal includes one of KTiOPO4 and KDP.

24. The system according to claim 18, wherein the semiconductor device includes a capping layer on the semiconductor layer and the optical system directs the filtered wave onto the semiconductor layer through the capping layer.

25. The system according to claim 18, wherein the semiconductor layer is on a substrate and the optical system directs the filtered wave onto the semiconductor layer through the substrate.

* * * * *